United States Patent
Guardala et al.

(10) Patent No.: US 8,363,775 B1
(45) Date of Patent: Jan. 29, 2013

(54) DOPING OF SEMICONDUCTOR MATERIALS BY NUCLEAR TRANSMUTATION

(75) Inventors: Noel A. Guardala, Columbia, MD (US); Ian Patrick Wellenius, Raleigh, NC (US); Jack L. Price, Jr., Derwood, MD (US); John F. Muth, Cary, NC (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 1181 days.

(21) Appl. No.: 11/998,861

(22) Filed: Nov. 26, 2007

Related U.S. Application Data (60) Provisional application No. 60/867,223, filed on Nov. 27, 2006.

(51) Int. Cl.
G21G 1/10 (2006.01)
(52) U.S. Cl. .................. 376/183; 376/190
(58) Field of Classification Search .......... 376/183; G21G 1/10, 1/06
See application file for complete search history.

(56) References Cited

U.S. PATENT DOCUMENTS

| | | | | |
|---|---|---|---|---|
| 5,037,602 | A * | 8/1991 | Dabiri et al. | 376/198 |
| 5,586,153 | A * | 12/1996 | Alvord | 376/196 |
| 5,875,052 | A | 2/1999 | Shmagin et al. | |
| 6,100,168 | A | 8/2000 | Liao et al. | |
| 6,114,225 | A | 9/2000 | Liao et al. | |
| 6,423,983 | B1 | 7/2002 | Narayan et al. | |
| 6,518,077 | B2 | 2/2003 | Narayan et al. | |
| 6,580,084 | B1 * | 6/2003 | Hiramoto et al. | 250/505.1 |
| 7,795,120 | B1 | 9/2010 | Price et al. | |
| 2009/0257543 | A1 * | 10/2009 | Mirzadeh et al. | 376/197 |

OTHER PUBLICATIONS

Wellenius, P., "Nitrogen Doping and Ion Beam Processing of Zinc Oxide Thin Films", Master Thesis, North Carolina State University, Jan. 5, 2006.*
Source information on Wellenius, P., "Nitrogen Doping and Ion Beam Processing of Zinc Oxide Thin Films", Master Thesis, North Carolina State University, issued Jan. 5, 2006.*
Kozlovskii et al., Radiation Doping Methods of Semiconductor Materials: "The Nuclear Doping by Charged Particles", Radiation Effects and Defects in Solids 138, 75-101 (1996).*
Didik et al., "Profiles of transmutation isotopes formed in solids by irradiation with charged particles: Formation, analysis and use", Nuclear Instruments and Methods in Physics Research B 160, pp. 387-396 (2000).*
Hahn et al, "Interactions of 3He particles with 9Be, 12C, 15O, and 19F", vol. 146, No. 3, Jun. 17, 1966, pp. 65-659.*
Holland, O.W., "Interaction of MeV Ions with pre-existing damage in Si: A new ion beam annealing mechanism", AppliedPhysics Letters 54(4), pp. 320-322 Jan. 1989.*

(Continued)

*Primary Examiner* — Johannes P Mondt
(74) *Attorney, Agent, or Firm* — Howard Kaiser (57) ABSTRACT

As typically embodied, the inventive method features bombardment of atomic nuclei with $^3$He ions in order to effect transmutation of atoms from a first atomic element to a second atomic element. Two notable inventive genres describe transmutation of: oxygen to nitrogen in an oxygen-containing target (e.g., including ZnO film); and, carbon to boron in a carbon-containing target (e.g., including SiC film). According to the former, transmutation of $^{16}$O to $^{15}$N occurs; more specifically, transmutation of $^{16}$O to $^{15}$O occurs via nuclear bombardment, and then transmutation of $^{15}$O to $^{15}$N occurs via decay by positron emission. According to the latter, transmutation of $^{12}$C to $^{11}$B occurs; more specifically, transmutation of $^{12}$C to $^{11}$C occurs via nuclear bombardment, and then transmutation of $^{11}$C to $^{11}$B occurs via decay by positron emission. Inventive practice frequently results in significant alteration of at least one physical property among: electronic carrier concentration; resistivity; photoconductivity; luminescence; morphology.

19 Claims, 10 Drawing Sheets

OTHER PUBLICATIONS

Ian Patrick Wellenius, Anuj Dhawan, John F. Muth, Noel A. Guardala, and Jack L. Price, "Improved Photoconductivity of ZnO by Ion Beam Bombardment," Materials Research Society (MRS) Symposium Proceedings, vol. 891, pp. 473-478, Warrendale, Pennsylvania, 2006, MRS Symposium held Nov. 28-Dec. 1, 2005, Boston, Massachusetts.

O. W. Holland, "Interaction of MeV Ions with Pre-Existing Damage in Si: A New Ion Beam Annealing Mechanism," Applied Physics Letters, vol. 54, No. 4, pp. 320-322, Jan. 23, 1989.

R. L. Hahn and E. Ricci, Interactions of 3He Particles with 9Be, 12C, 16O, and 19F, Physical Review, vol. 146, No. 3, pp. 650-659, Jun. 17, 1966.

(Ian Patrick Wellenius, Anuj Dhawan, John F. Muth, Noel A. Guardala, and Jack L. Price, "Improved Photoconductivity of ZnO by Ion Beams Bombardment," Materials Research Society (MRS) Symposium Proceedings, vol. 891, pp. 473-478, Warrendale, Pennsylvania, 2006, MRS Symposium held Nov. 28-Dec. 1, 2005, Boston, Massachusetts).

* cited by examiner

| Film | Dose (mC) | Time (s) | Avg BOT (nA) | Est. Dopant density (cm$^{-3}$) |
|---|---|---|---|---|
| ZnO_0803 | 8.55 | 16100.3 | 531 | 2.52E+14 |
| ZnO_0804 | 8.86 | 21062.5 | 421 | 2.38E+14 |
| ZnO_0809 | 12.2 | 21190.3 | 577 | 3.04E+14 |
| ZnO_0810 | 9.84 | 15931.4 | 617 | 1.18E+14 |
| ZnO_0812 | 17.1 | 17344.7 | 988 | 2.98E+14 |

DOPING OF SEMICONDUCTOR MATERIALS BY NUCLEAR TRANSMUTATION

CROSS-REFERENCE TO RELATED APPLICATIONS

This application claims the benefit of U.S. provisional patent application No. 60/867,223, filing date 27 Nov. 2006, hereby incorporated herein by reference, invention title "Doping of Oxygen- and Carbon-Containing Materials by Nuclear Transmutation Using High Energy 3-He Ion Beams," joint inventors Noel A. Guardala, Ian Patrick Wellenius, Jack L. Price, John F. Muth.

STATEMENT OF GOVERNMENT INTEREST

The invention described herein may be manufactured and used by or for the Government of the United States of America for governmental purposes without payment of any royalties thereon or therefor.

BACKGROUND OF THE INVENTION

The present invention relates to semiconductor materials, more particularly to methods and systems for doping or otherwise changing the physical character of semiconductor materials.

Conventional doping methodologies include (i) ion implantation, (ii) diffusion, and (iii) incorporating dopant atoms during the semiconductor growth. Ion implantation is typically carried out using a dedicated implanter that accelerates ionized dopant species toward the semiconductor material, with energies typically in the 100-1000 keV range. Diffusion is typically accomplished using a high temperature furnace, with either a gas source or a solid source for the dopants; the high temperatures allow dopants to diffuse into the material.

Ion implantation, diffusion and similar processes have been limitedly successful in doping wide bandgap materials, including zinc oxide (ZnO), diamond and others. These conventional approaches have not enjoyed complete success for some modern electronic materials because of defect production and/or poor site activation. Ion implantation is an inherently destructive process, creating significant damage in the target material lattice, which must be annealed to produce a quality material. Several materials (silicon carbide, diamond, etc.) anneal at extraordinarily high temperatures, thus making an ion implantation process difficult and costly. Diffusion can be difficult due to the high thermal requirements of certain materials. In addition, defects in materials such as ZnO can lead to self-compensation.

It is therefore desirable in the semiconductor and related arts to devise a doping methodology that is not intrinsically destructive. This quality of non-destructiveness could have a significant positive impact on several industries, including high power electronics, solid state lighting, ultraviolet (UV) light detection, and transparent coatings.

SUMMARY OF THE INVENTION

In view of the foregoing, an object of the present invention is to provide an inherently non-destructive doping methodology. A further object of the present invention is to provide such a doping methodology that is practical and cost-effective.

Great difficulty has been encountered in conventional approaches to doping semiconductor films (e.g., ZnO films) to produce p-type material. This difficulty is largely associated with donor-like defects (e.g., oxygen vacancies and zinc interstitials in ZnO material) that easily form during deposition or processing. As distinguished from conventional doping methodologies, the inventive methodology does not encourage compensating defect formation.

The present invention provides a novel methodology for altering the physical character of a material such as a semiconductor material. In accordance with typical embodiments of the present invention, semiconductor materials are doped by nuclear transmutation using high energy $^3$He ion beams. Conventional doping methodologies, such as ion implantation and dopant diffusion, have been less than entirely successful because of their destructive nature and their difficult and expensive implementation. In contrast, the present invention's methodology is inherently non-destructive and is relatively easy and inexpensive to practice.

Conventional methodologies involve the insertion of atoms into a material in order to change the material's physical character in one or more respects. As distinguished from conventional methodologies, the inventive methodology involves the transmutation of atoms already existing in the material in order the change the material's physical character in one or more respects. The present invention provides a unique methodology for the electronic doping of semiconductor materials using $^3$He ion beams.

In sum, the present invention as typically practiced provides for nuclear transmutation of the target material via irradiation thereof by high energy $^3$He ion beams. A material sample is provided that includes atoms that are nuclearly transmutable via bombardment by helium three ions. A beam of energetic $^3$He ions is emitted so as to be incident on the target material. The beam causes a nuclear reaction in the target material whereby the target species is transmuted to another species. The present invention is typically embodied as a method for changing the physical character of a material, such as a semiconductor material. The inventive irradiation typically results in changing one or more of the following physical characteristics of the material sample: electronic carrier concentration (e.g., generation of p-type carriers, thereby increasing the concentration of p-type carriers); electronic carrier type; resistivity; photoconductivity; luminescence; morphology. Which and to what extent physical characteristics are inventively altered may relate to the material of the sample; for instance, SiC is generally not considered a strong source of luminescence. Two notable genres of the inventive methodology involve (i) the electronic doping of oxygen-containing materials using $^3$He ion and (ii) the electronic doping of carbon-containing materials using $^3$He ion beams.

The present inventors experimentally demonstrated the efficacy of the present invention with respect to the first above-stated genre of the present invention's methodology, viz., involving the electronic doping of oxygen-containing materials using $^3$He ion beams. In their testing the present inventors used the Tandem Pelletron Positive—Ion Accelerator Facility (PIAF) at the Naval Surface Warfare Center, Carderock Division (NSWCCD), located in West Bethesda, Md. The Tandem Pelletron PIAF includes a particle accelerator that accelerates negative ions to a positive potential (up to a maximum positive potential of three million volts), strips electrons from negative ions, and then accelerates the resultant positive ions towards a ground potential. Included in the Tandem Pelletron PIAF are an energy/charge-selection magnetic component and a pumping component. This particle accelerator facility is capable of accelerating most atomic species with energies from 0.3 to 30 MeV. Among the possible applications of this particle accelerator facility are material modification through doping with foreign ions, and material characterization by a variety of ion beams.

In accordance with frequent inventive practice, either an oxygen-containing material (e.g., zinc oxide) or a carbon-containing material (e.g., silicon carbide) is doped via $^3$He transmutation. According to an inventive oxygen-to-nitrogen transmutation, $^{16}$O is transmuted to $^{15}$N; more specifically, $^{16}$O is initially transmuted by $^3$He ion beam bombardment to $^{15}$O, which in turn decays by positron emission to $^{15}$N. The transmuted element (i.e., oxygen-to-nitrogen in the case of an oxygen-containing material such as ZnO) acts as an electronic dopant in the host semiconductor. According to an inventive carbon-to-boron transmutation, $^{12}$C is transmuted to $^{11}$B; more specifically, $^{12}$C is initially transmuted by $^3$He ion beam bombardment to $^{11}$C, which in turn decays by positron emission to $^{11}$B. The transmuted element (i.e., carbon-to-boron in the case of a carbon-containing material such as SiC) acts as an electronic dopant in the host semiconductor. The half lives for $^{15}$O and $^{11}$C are 124 seconds and 20.38 minutes, respectively.

The present invention's $^3$He transmutation doping affords several advantages over conventional doping methodologies, among which are less lattice damage near the active region, and reduced interstitial dopants. Further, the inventive doping methodology is capable of doping materials that, according to conventional methodologies, are very difficult to work with.

In accordance with typical inventive practice, lattice damage is significantly reduced in the vicinity of the active region, since nuclear scattering rarely occurs at such high energies. Because nuclear scattering occurs at much lower energies, such nuclear scattering events, if they occur, tend to occur far away from the active region. For instance, in cases involving thin films, the nuclear scattering region may be distanced well into the substrate material. Generally, when the present invention's high energy bombardment is effectuated, the transmutation that is brought about in the active region has concomitant therewith only a small amount of momentum transferal to the lattice, due to the high mass difference between the incident ion and the target nucleus.

Furthermore, according to typical embodiments of the present invention, the material is doped by transmuting a nucleus that is already on the lattice site; therefore, most of the dopants will remain on or near their original lattice site. It is possible that enough momentum would be transferred to the target nucleus during the transmutation that the transmuted species would be dislodged from the lattice; nevertheless, even if this were to occur, the distance that the dislodged transmuted species would travel from its site would be very small. This inventive attribute of "staying home or close to home" reduces the amount of annealing required to produce quality doped material, and facilitates the production of devices based on these materials.

An additional advantage of the present invention over implantation and diffusion lies in the superior quality of the resultant doped layer. Because of the uniformity of the cross section over a range of beam energies, the present invention's doping via $^3$He transmutation produces a relatively thick and relatively uniform doped layer in the material. In contrast, according to diffusion, the bulk of the dopants will inevitably be near the surface through which they enter, and a density gradient will occur through the thickness. Ion implantation produces more uniform layers than does diffusion, but requires implanting at multiple energies to produce thick layers; this is because the implantation profile is a function of both the stopping power of the target material and the initial ion beam energy.

In the present invention's $^{16}$O ($^3$He, $^4$He) $^{15}$O reaction, the transmutation and decay process ultimately produces atomic nitrogen (N), as opposed to molecular nitrogen ($N_2$). $N_2$ complexes are energetically stable and can be highly unpredictable in their electronic behavior. Due to their stability, $N_2$ complexes are very difficult to anneal once they are in the material and, as such, are highly undesirable. Thus, in order to avoid these stable complexes, it is generally important in practice of this inventive genre to use sources of atomic nitrogen, rather than sources of molecular nitrogen, for doping electronic materials.

The inventive methodology is and will be a viable option for existing and newly discovered materials. Traditional methodologies such as ion implantation and diffusion will remain an option for newly discovered materials, but will require significant study and improvement in order to minimize defect production and optimize material performance. While annealing is possible for most materials, higher temperatures make extensive annealing very costly, especially in terms of mass production of devices.

$^3$He (also referred to herein as "helium three" or "helium-3") is an isotope of helium that contains two protons and one neutron. $^3$He occurs in nature much more rarely than the most prevalent isotope of helium, namely, $^4$He (also referred to as "helium four" or "helium-4"), which contains two protons and two neutrons. Typical embodiments of the present invention's nuclear transmutation doping provide for $^3$He ion transmutation doping; otherwise expressed, the present invention effectuates doping using a beam composed entirely of helium three ions. The present inventors have considered an alternative mode of the present invention's ion beam nuclear transmutation doping, namely, that which involves proton transmutation doping—that is, doping using beams of protons, rather than beams of whole atoms that are ions. As elaborated upon in the next paragraph, the present inventors believe that their $^3$He ion transmutation doping concept is superior to their proton transmutation doping concept in several respects.

A major drawback to proton transmutation is that the reactions typically occur only for rare isotopes, such as $^{13}$C, $^{15}$N, or $^{18}$O. While the cross sections may be quite high, the natural paucity of the reactive isotopes will tend to result in very small dopant yields. By comparison, $^3$He transmutations are known to occur with several common isotopes, such as $^{12}$C and $^{16}$O. Furthermore, the cross sections associated with the inventive $^3$He transmutation doping are similar in magnitude to those associated with the inventive proton transmutation doping, but will ultimately yield higher dopant concentrations. Moreover, proton transmutation doping typically results in a thin doped region, due to the resonant nature of the cross section for proton interaction. In contrast, the cross section for an inventive $^3$He interaction is typically quite broad, and hence a thicker doped region of similar density will be produced. In fact, a $^3$He interaction cross section may be broad enough to create uniform doping through the full thickness of a thin film.

Aspects of the present invention are disclosed by the following paper, incorporated herein by reference: Ian Patrick Wellenius, Anuj Dhawan, John F. Muth, Noel A. Guardala and Jack L. Price, "Improved Photoconductivity of ZaO by Ion Beam Bombardment," *Materials Research Society Symposium Proceedings*, Volume 891, pages 473-478, Materials Research Society (MRS), Warrendale, Pa., 2006, Symposium held Nov. 28-Dec. 1, 2005, Boston, Mass.

Aspects of the present invention are also disclosed by the following master's thesis, incorporated herein by reference: Ian Patrick Wellenius, "Nitrogen Doping and Ion Beam Processing of Zinc Oxide Thin Films," master of science degree, electrical engineering graduate program, date of defense 14 Dec. 2005, URN etd-01042006-015801; available online on or after 14 Dec. 2005 on the ETD (Electronic Theses and Dissertations) web page of North Carolina State University.

Other objects, advantages and features of the present invention will become apparent from the following detailed description of the present invention when considered in conjunction with the accompanying drawings.

BRIEF DESCRIPTION OF THE DRAWINGS

The present invention will now be described, by way of example, with reference to the accompanying drawings, wherein:

As shown in FIG. 1, the reaction product is $^{15}$O, which decays by positron emission with a half-life of approximately 2 minutes. The decay process shown in FIG. 1 produces $^{15}$N. As shown in FIG. 2, the reaction product is $^{18}$F, which decays by positron emission with a half-life of approximately 2 hours. The decay process shown in FIG. 2 produces $^{18}$O.

FIG. 8 illustrates circular features as they formed after irradiation. FIG. 9 and FIG. 10 illustrate collapse of the circular features after scribing. FIG. 11, a 320$nm$ CL micrograph of the same region shown in FIG. 10, illustrates CL emission after scribing, and further illustrates complete exposure of the sapphire substrate.

FIG. 12 and FIG. 13, comparatively considered, illustrate: (a) a significant increase in resistivity of the irradiated zinc oxide film versus the unirradiated zinc oxide film; and, (b) a significant increase in the electronic response to UV excitation of the irradiated zinc oxide film versus the unirradiated zinc oxide film.

DETAILED DESCRIPTION OF THE INVENTION

In its basic principle, the present invention effects nuclear transmutation doping (NTD), according to which a nuclear reaction is induced using an energetic ion incident on a lattice atom, thereby producing an atom of a different species in the material. The present invention uniquely features the utilization of high energy $^3$He ion beams to bring about nuclear transmutation of materials.

Of particular interest to the present inventors is their novel use of high energy $^3$He ion beams to effectuate nuclear transmutation of zinc oxide, whereby nitrogen is produced from a reaction with oxygen in a crystalline ZnO thin film. As elaborated upon hereinbelow, the present inventors successfully tested this mode of inventive practice and found that, vis-à-vis the original zinc oxide films, the inventively doped zinc oxide films were significantly different in terms of resistivity, photoconductivity, scanning electron microscopy, cathodoluminescence, and ion beam analysis. Of particular note, the inventively irradiated zinc oxide films exhibited increased resistivity, increased photoconductivity, and decreased defect luminescence. The latter two findings were consistent with the observed increases in resistivity.

ZnO thin films were grown on c-plane sapphire substrates by pulsed laser deposition (PLD) using a Neocera Pulsed Energy Deposition system at North Carolina State University, located in Raleigh, N.C. The zinc oxide films were subsequently annealed to produce resistive material. The PLD system utilizes a KrF excimer laser, pulsing at 10 Hz with an estimated energy density up to 4 J/cm$^2$. Films were grown at 700° C., with an oxygen partial pressure of 35 mTorr for 36,000 pulses. Although substrates made of sapphire were utilized in the inventive testing, inventive practice lends itself to substrates made of a variety of suitable materials.

The zinc oxide films that were used for the testing of the present invention were annealed by the present inventors for 8 hours in air at 800° C. Previously, the present inventors conducted a study of time-dependent annealing in order to select a suitable duration for the annealing of the zinc oxide films. Their time-dependent annealing study demonstrated that excessively long annealing at 800° C. caused substantial degradation in film quality. In this study, films were annealed in air, using a quartz tube furnace. It was observed that resistivity and surface morphology improved substantially within the first 3 hours of annealing, and continued to improve marginally with successive anneals. Rutherford backscattering spectroscopy (RBS) data showed that optimal stoichiometry was achieved after 15 hours of annealing, before the films began to deteriorate.

Figure 1:
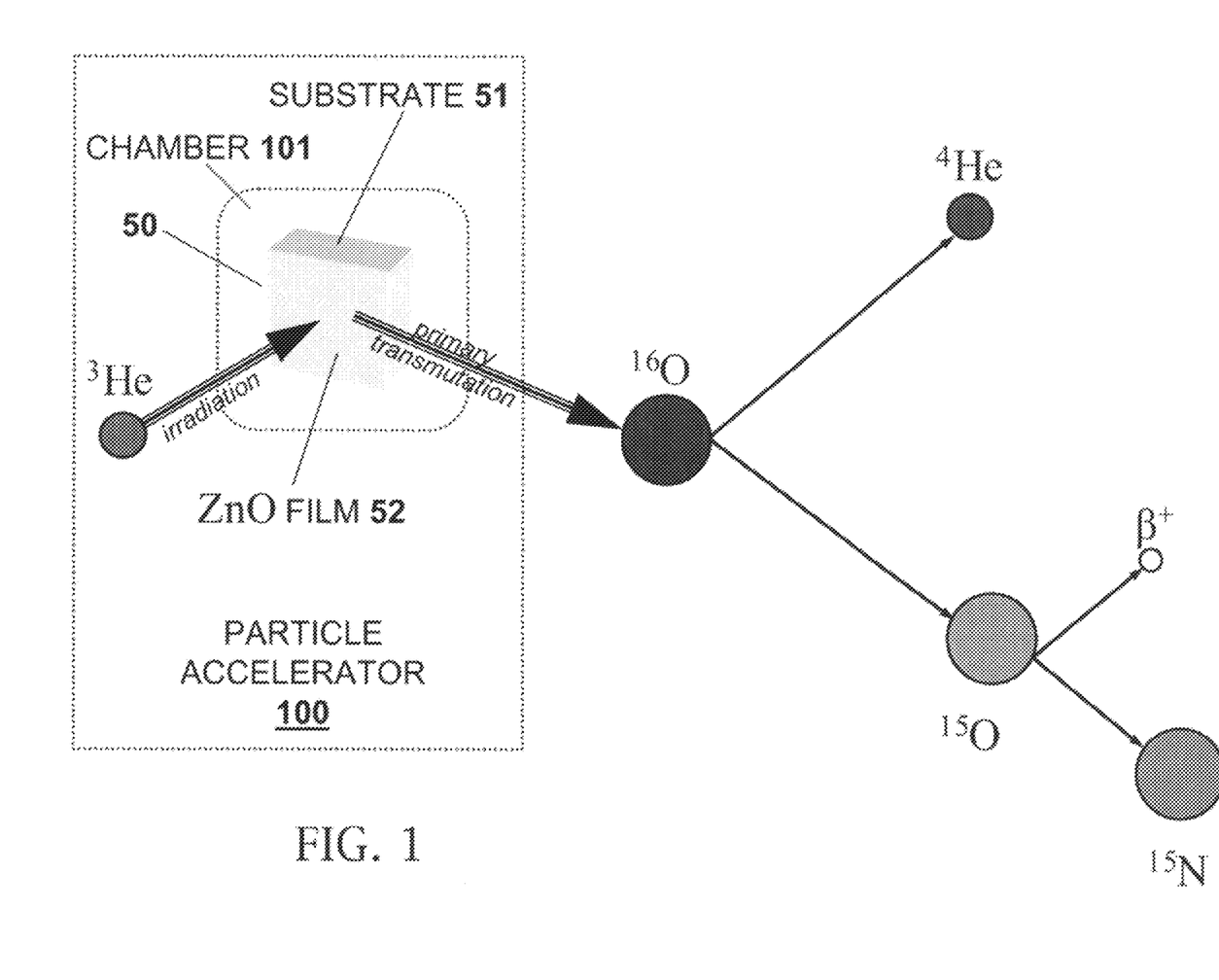
FIG. 1 and FIG. 2 are diagrams of the two nuclear reactions that are produced by irradiating a ZnO target with a 6.6 MeV $^3$He ion beam, in accordance with the present invention.
Figure 2:
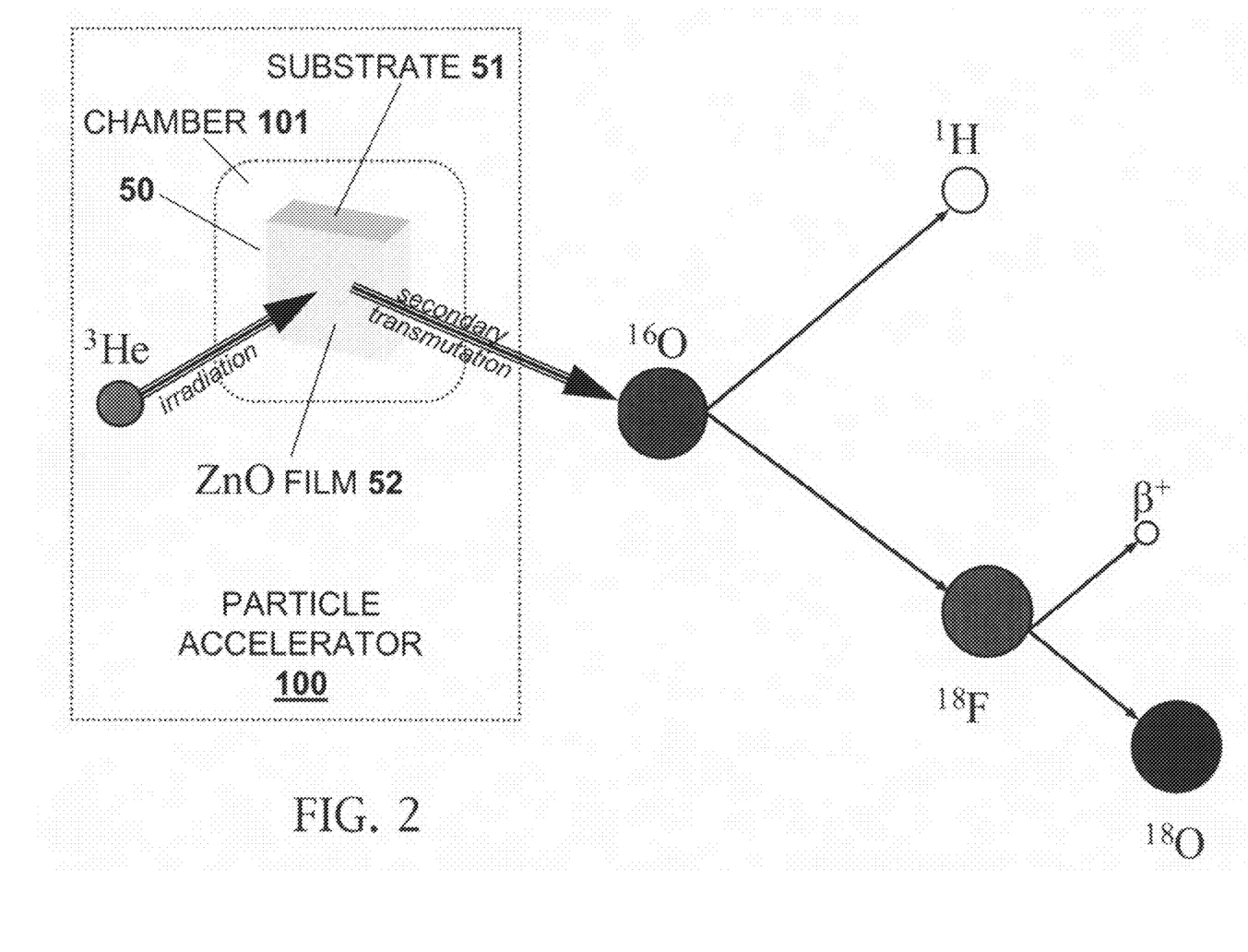

Reference is now made to FIG. 1 and FIG. 2. After annealing, the zinc oxide films were irradiated at the Positive Ion Accelerator Facility (PIAF) of the Naval Surface Warfare Center Carderock Division (NSWCCD) in West Bethesda, Md. The PIAF operates a 3 MV National Electrostatics Corporation tandem pelletron accelerator that is equipped with a radio frequency (RF) source for making ion beams from gaseous elements (H, He, N), and a cesium sputtering source for producing ion beams from a variety of solid cathodes. A ninety degree analyzing magnet, controlled by nuclear magnetic resonance (NMR), allows precise definition of the mass-energy of the ion beam. Assorted experimental beam lines are equipped to monitor gamma rays, backscattered particles and x-rays for a variety of ion beam analyses, including Rutherford backscattering spectrometry (RBS), nuclear reaction analysis (NRA), and particle induced x-ray emission (PIXE).

A particle accelerator is an electrical device that accelerates to high energies either charged atomic particles (e.g., positively or negatively charged ions), or charged subatomic particles (e.g., protons or electrons). A particle accelerator can, at least in theory if not in practice, accelerate any atomic particle (e.g., charged ion) from among the variety of elements and corresponding isotopes in the periodic table of elements. A typical tandem electrostatic accelerator has two phases of acceleration, viz., a first phase of attracting negatively charged ions, and a second phase of repelling positively charged ions. In operation of the tandem accelerator, negatively charged ions gain energy by attraction to a high positive voltage. Electrons are then stripped from the negatively charged ions, which consequently become positively charged ions. The positively charged ions are then accelerated away by the high positive voltage.

Positively charged $^3$He ions are practiced in accordance with typical embodiments of the present invention. A tandem accelerator is one of several kinds of particle accelerators that can be used in inventive practice to generate a beam of $^3$He ions. According to some embodiments of inventive practice, a tandem accelerator will operate so as to acceleratively input negatively charged helium-3 ions and acceleratively output positively charged helium-3 ions. Negatively charged helium-3 ions (helium-3 atoms characterized by more electrons than characterize a neutrally charged helium-3 atom) are attracted to a high positive voltage and are stripped of some of their electrons so as to become positively charged helium-3 ions (helium-3 atoms characterized by fewer electrons than characterize a neutrally charged helium-3 atom). The positively charged helium-3 ions are repelled by the high positive voltage. According to typical inventive practice, each $^3$He ion that is beamed upon a material sample (e.g., material entity 50 shown in FIG. 1 and FIG. 2) is a positively charged helium-3 atom that is characterized by fewer electrons than characterize a neutrally charged (nonionic) helium-3 atom.

In the inventive testing, a 6.6 MeV $^3$He ion beam was used to induce two nuclear reactions, viz., a nitrogen-producing reaction (shown in FIG. 1) and a fluorine-producing reaction (shown in FIG. 2), in zinc oxide films. The ZnO films were irradiated by the $^3$He ion beam using NSWCCD's tandem accelerator, diagrammatically depicted in FIG. 1 and FIG. 2 as particle accelerator apparatus 100, which included an irradiation chamber 101. The target entity 50, which included a substrate 51 and a zinc oxide film 52 situated upon substrate 51, was appropriately situated in chamber 101 for bombardment by $^3$He ions.

As a result of the irradiation by $^3$He ions, two nuclear transmutations took place. As illustrated in FIG. 1, the nitrogen-producing nuclear reaction was $^{16}$O ($^3$He, alpha) $^{15}$O, where the oxygen isotope decays to $^{15}$N by positron emission. As illustrated in FIG. 2, the fluorine-producing nuclear reaction was $^{16}$O ($^3$He, $^1$H) $^{18}$F. The fluorine-producing reaction was similar to the nitrogen-producing reaction and occurred simultaneously therewith.

In the fluorine-producing reaction, the unstable fluorine isotope decays also by positron emission to $^{18}$O. Thus, there is a null net effect from the fluorine-producing reaction. The unstable fluorine isotope that is produced as shown in FIG. 2 decays with a half life of 110 minutes; therefore, after about 30 hours, the fluorine population has decayed to one millionth of its maximum. Accordingly, the ZnO films were actually doped using the reaction $^{16}$O ($^3$He, alpha) $^{15}$O, where the product decays by positron emission to $^{15}$N with a half life of 124 seconds.

The irradiations were initially carried out in a chamber 101 that was equipped with a particle detector to monitor the emission of alpha particles due to the reactions. However, high levels of neutron and gamma emission required that the zinc oxide films be irradiated in a shielded chamber 101, and the only such chamber at the PIAF is not designed for particle detection.

Figure 3:
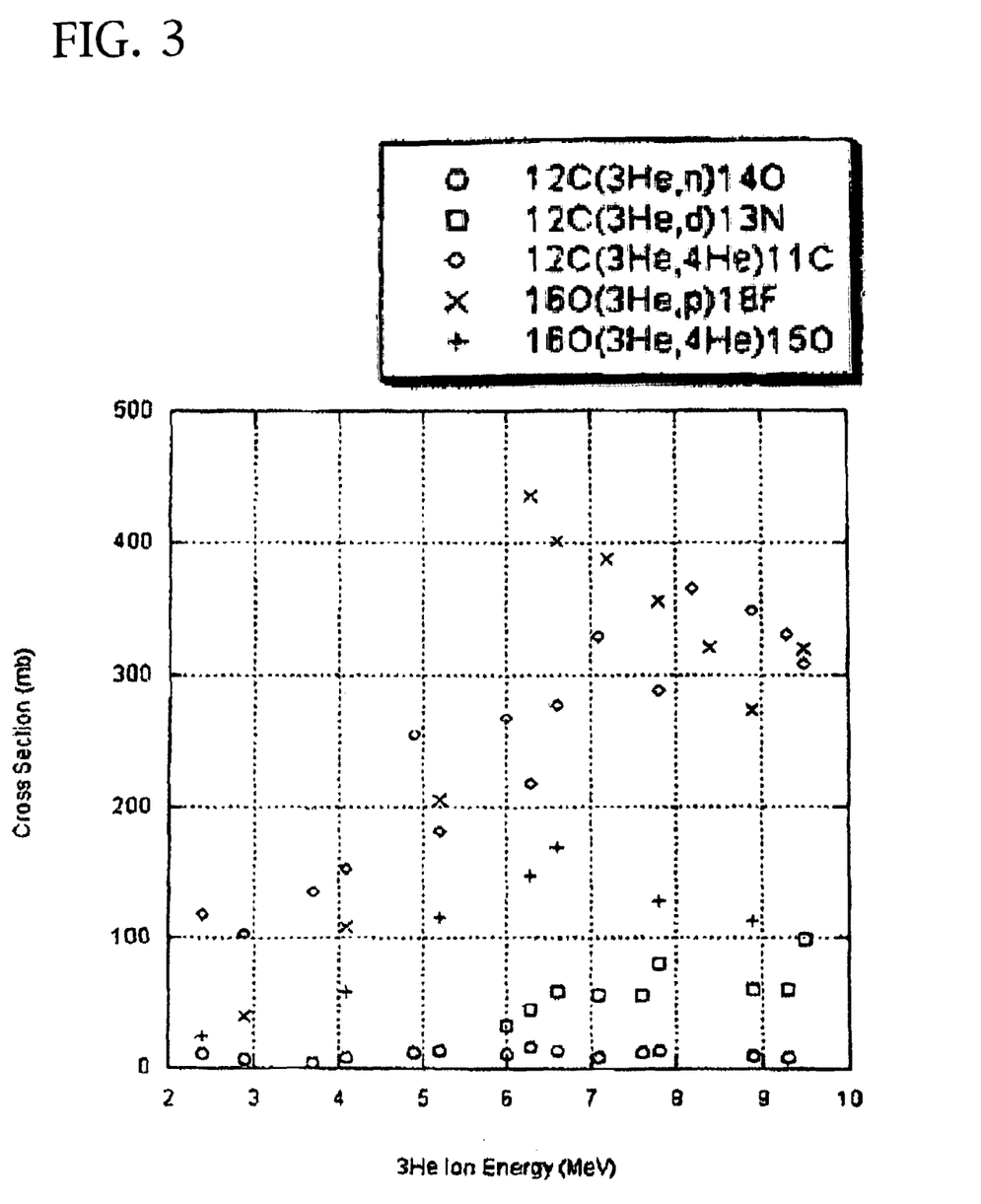
FIG. 3 is a graph of cross-sections for $^3$He transmutations, over the range of 2 to 10 MeV, with respect to (i) oxygen nuclei (x, +) and (ii) carbon nuclei (O, □, o).
Figure 4:
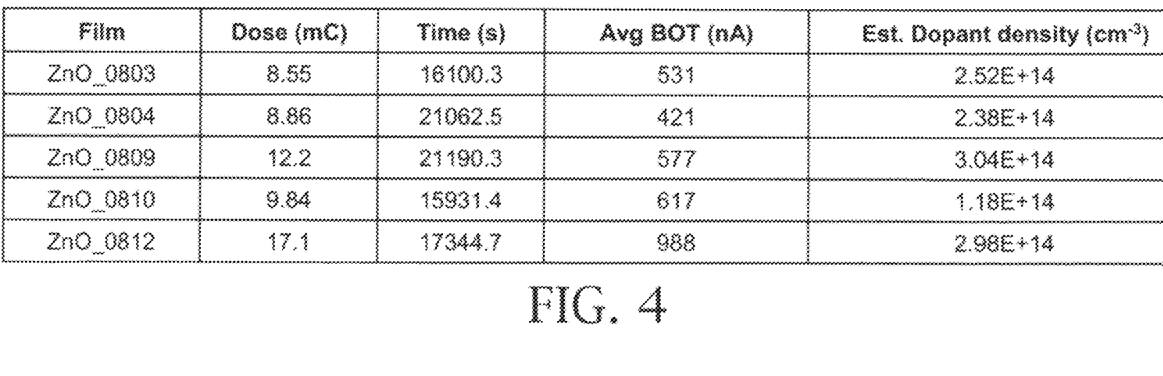
FIG. 4 is a table of irradiation data and the estimated nitrogen density for each zinc oxide film that was tested by the present inventors.

With reference to FIG. 3 and FIG. 4, the zinc oxide films 52 were each irradiated for a duration in the range between 4 and 6 hours, the irradiation ranging in total dose from 8.5 to 17.1 mC. As indicated in FIG. 4, this yields an estimated nitrogen density in the approximate range between $(1 \times 10^{14}$ cm$^{-3})$ and $(3 \times 10^{14}$ cm$^{-3})$. It can generally be said that the cross-sections of the present invention's two nuclear transmutations reactions that are respectively shown in FIG. 1 and FIG. 2 are rather strong and broad, as compared to other nuclear transmutation reactions that may occur in nature.

FIG. 3 illustrates cross sections characterizing the two nuclear transmutation reactions associated with the inventive irradiation, using $^3$He ion beams, of an oxygen-containing material such as zinc oxide (ZnO). As illustrated in FIG. 3, the peak cross section of 169 mb for the nitrogen-producing reaction, the reaction of real interest, occurs near 6.6 MeV ion beam energy. The fluorine-producing reaction peaks at a slightly lower ion beam energy, but with a much higher peak cross section of 436 mb; again, this is of little concern, as the $^{18}$F product rapidly decays to $^{18}$O. FIG. 3 also illustrates cross sections characterizing the three nuclear transmutation reactions associated with the present invention's conceptual irradiation, using $^3$He ion beams, of a carbon-containing material such as silicon carbide (SiC).

Four-point probe resistivity measurements were performed of the irradiated zinc oxide films. The resistivity measurements were taken of the irradiated zinc oxide films using a Lucas 307 probe station and a Signatone 4-point probe head with rounded osmium tips, spaced 1 mm apart. A Keithley 220 programmable current source was used to drive a current through the sample, and the resulting voltage was measured by a Keithley 6517a high-impedance electrometer. The resistivity of the zinc oxide films increased from between 50 and 135 ohm-cm, before irradiating, to between 450 and 500 ohm-cm, after irradiating. This was observed by measuring a control sample and by comparing the resistivity of the films in the irradiated and unirradiated portions.

Figure 6:
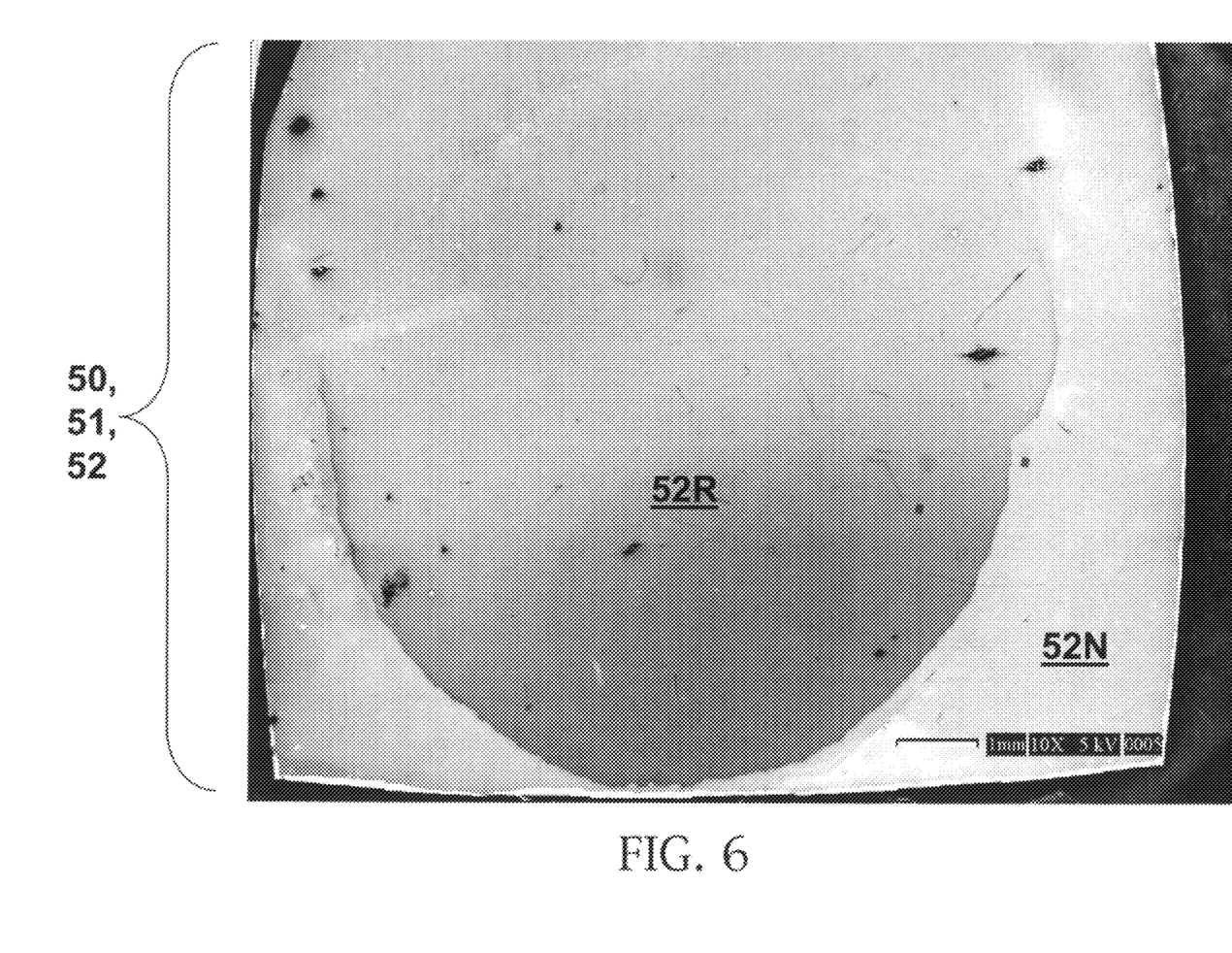
FIG. 6 is an SEM micrograph of a zinc oxide film, wherein the irradiated region 52R, generally centralized, is clearly distinguishable from the nonirradiated region 52N, generally peripheral. The demarcation between the irradiated region and the nonirradiated region is generally round.

Cathodoluminescence (CL) emission was measured using an Oxford MonoCL monochromator with a liquid-cooled photomultiplier tube (PMT) attached to a JEOL JSM-6400 thermionic emission scanning electron microscope (SEM). Reference now being made to FIG. 6, the green-yellow cathodoluminescence (CL), which can be attributed to point defects in ZnO, was observed to decrease substantially in the irradiated portions 52R of the zinc oxide films, as compared to the unirradiated portions 52N of the zinc oxide films 52.

The changes in resistivity and CL emission are most likely caused by ion beam annealing, since the doping concentration of the films by nitrogen is too low to be expected to appreciably compensate the films. MeV-range light ion beams have been observed to anneal point defects in silicon; see O. W. Holland, "Interaction of MeV Ions with Pre-Existing Damage in Si: A new Ion Beam Annealing Mechanism," *Applied Physics Letters*, Volume 54, Number 4, pages 320-322 (23 Jan. 1989), incorporated herein by reference. Similar mechanisms may be at work in the irradiated ZnO films, which may anneal the point defects typically associated with n-type conductivity.

Figure 5:
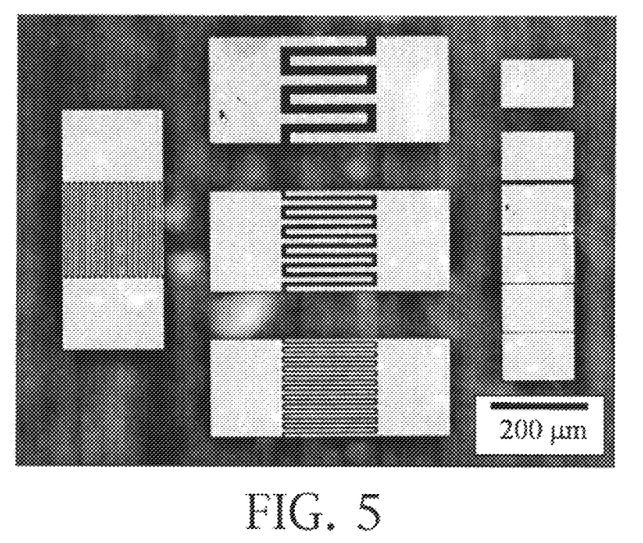
FIG. 5 is an optical micrograph of the interdigitated contacts that were fabricated by the present inventors on the unirradiated and irradiated zinc oxide films in their testing. Contacts of this type are useful for characterizing photoconductive responses of the unirradiated and inventively irradiated zinc oxide films.
Figure 7:
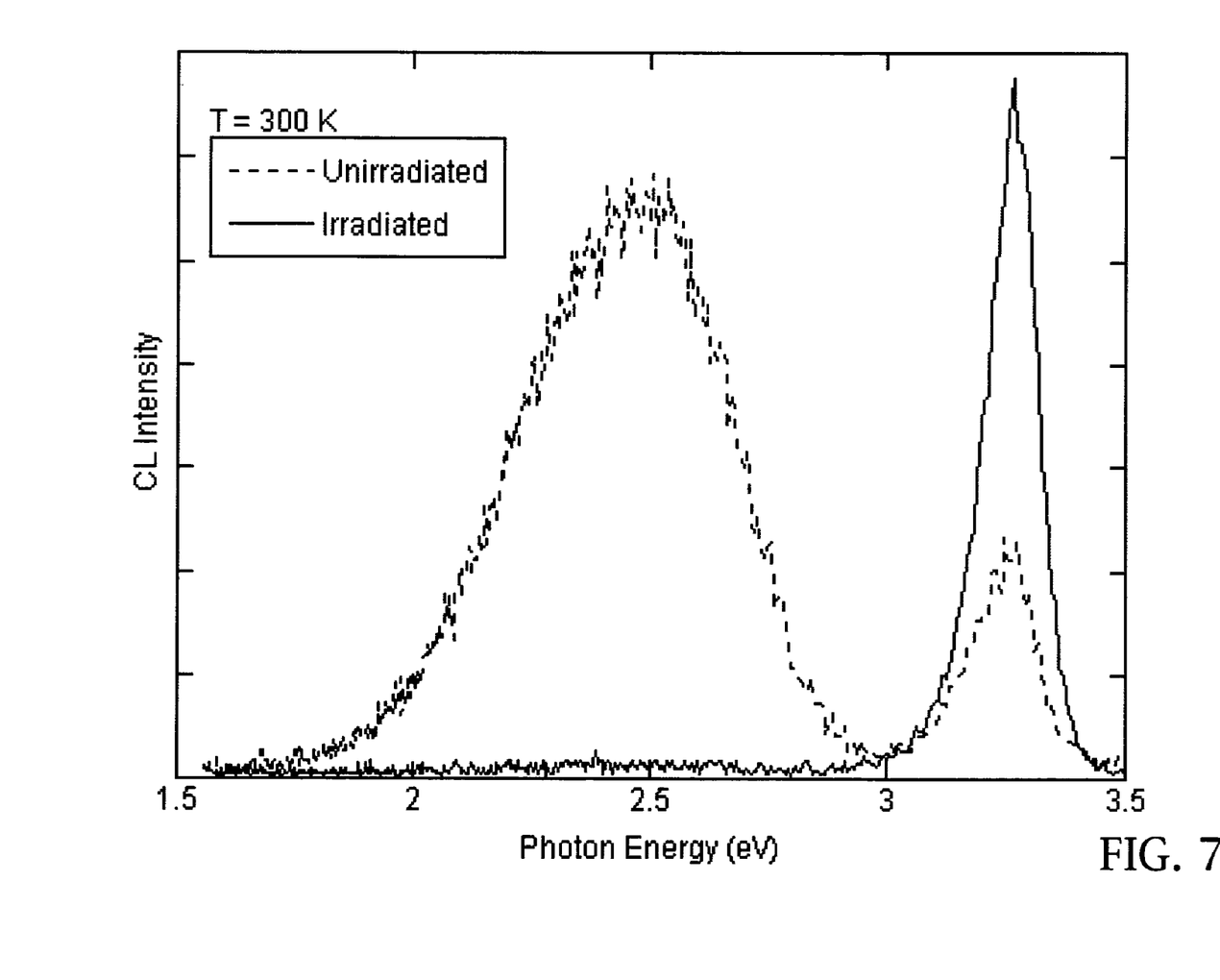
FIG. 7 is a cathodoluminescence (CL) spectrum graph comparing the irradiated region and the unirradiated region of a ZnO film. The defect emission centered near 2.5 eV is substantially decreased as compared to the band-band emission near 3.3 eV.
Figure 8:
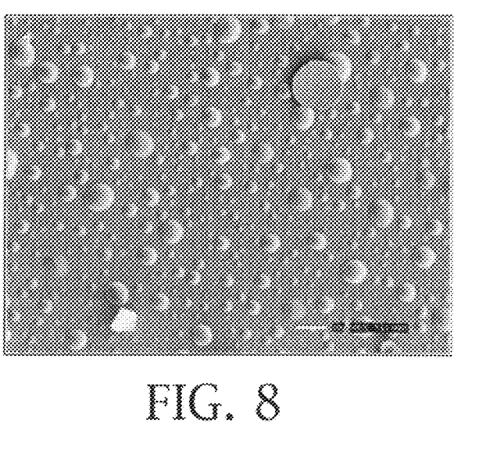
FIG. 8 through FIG. 11 are SEM micrographs of an irradiated zinc oxide film.
Figure 9:
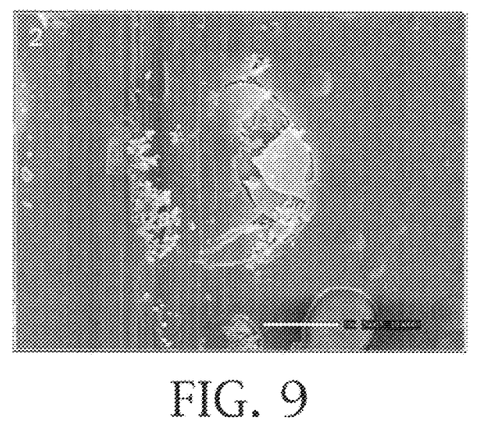
Figure 10:
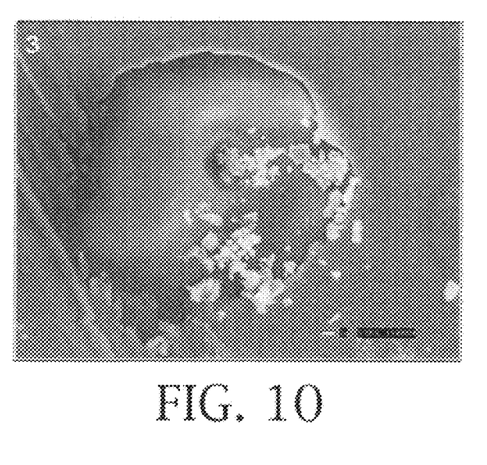

With reference to FIG. 7 and FIG. 8, scanning electron microscope (SEM) imaging and cathodoluminescence imaging of the inventively irradiated zinc oxide films were performed. When viewed with an SEM, the irradiated region of the film is easily discerned from the rest of the film surface due to a change in electron emission, as shown in FIG. 5. This is likely caused by the change in resistivity of the film by affecting how the film surface dissipates the charge from the electron beam. As positive charge accumulates on the more resistive surface, secondary electrons are less likely to escape the film surface and reach the detector, causing a darker appearance.

In general, the morphology of the films was not dramatically altered by the inventive ion beam process. One micron and five micron atomic force microscope (AFM) micrographs did not depict any measurable change in the surface roughness or morphology due to irradiation. However, as shown in FIG. 8 through FIG. 11, micron-sized circular features were observed on some of the irradiated films and across the entire surface of one film. To further study the nature of these features, a diamond scribe was used to lightly scratch the film surface and the damaged features were observed in the SEM. The SEM micrographs indicate that the structures have collapsed entirely as opposed to simply fracturing, which indicates that the round features were likely hollow or gas-filled rather than solid ZnO that may have expanded.

Figure 11:
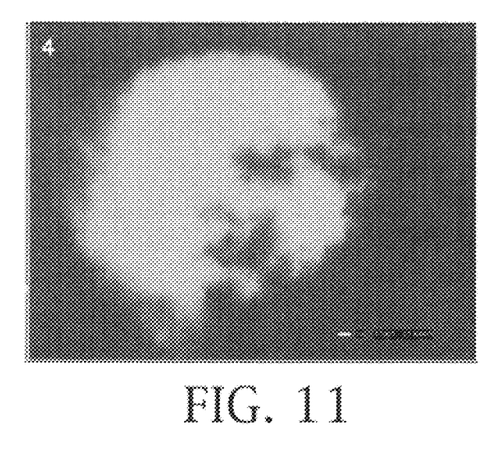

A CL image of one round feature, taken at 320 nm, demonstrates that there is no remaining ZnO film beneath the collapsed structure. That particular emission wavelength was chosen because sapphire has a defect state that emits near 320 nm, which cannot be confused with any ZnO emission. A similar CL image was taken of the same feature at 1 keV to demonstrate that there is no significant ZnO film remaining on the substrate where the feature used to exist. The range of the electron beam through ZnO at 1 keV is 10-15 nm.

Radiation blistering was observed in a previous study, in which materials were implanted with MeV-range H or He ions; see R. Behrisch, J. Bottiger, W. Eckstein, U. Littmark, J. Roth and B. M. U. Scherzer, "Implantation Profiles of Low-Energy Helium in Niobium and Blistering Mechanism," *Applied Physics Letters*, Volume 27, Number 4, pages 199-201 (1975), incorporated herein by reference. Behrisch et al. reported that there is a minimum critical dose required for blister formation, and suggested that the blisters are created by ion beam induced stresses. These stresses cause the H or He ions to migrate towards the surface, forming bubbles underneath the surface, which causes blister-like features; see X. Weng, W. Ye, R. S. Goldman and J. C. Mabon, "Formation and Blistering of GaAsn Nanostructure Layers," *Journal Of Vacuum Science and Technology B: Microelectronics and Nanometer Structures*, Volume 22, Number 3, pages 989-992 (May 2004), incorporated herein by reference. As the ions coalesce at the interface, they form bubbles or gas pockets, applying a pressure on the surface film, which causes the film to separate in some places from the substrate.

Photoconductive detectors were fabricated in the inventive testing by depositing 200 nm thick aluminum contacts on the ZnO film surface in an interdigitated finger structure. The fingers were spaced 3, 5, 10 and 20 microns apart in each of the four device sizes. Transfer length method (TLM) measurement structures such as shown in FIG. 5 were also deposited upon the ZnO film surface, but were not used in the inventive testing. Dark and illuminated current-voltage measurements were taken using a parameter analyzer, and the samples were illuminated using a small mercury lamp. The spectrally resolved photo-response was characterized using an Oriel illuminator and monochromator, equipped with a xenon lamp. Again, the Keithley 220 current source was used to bias the devices, and the Keithley 6517a electrometer was used to measure the voltage.

Figure 12:
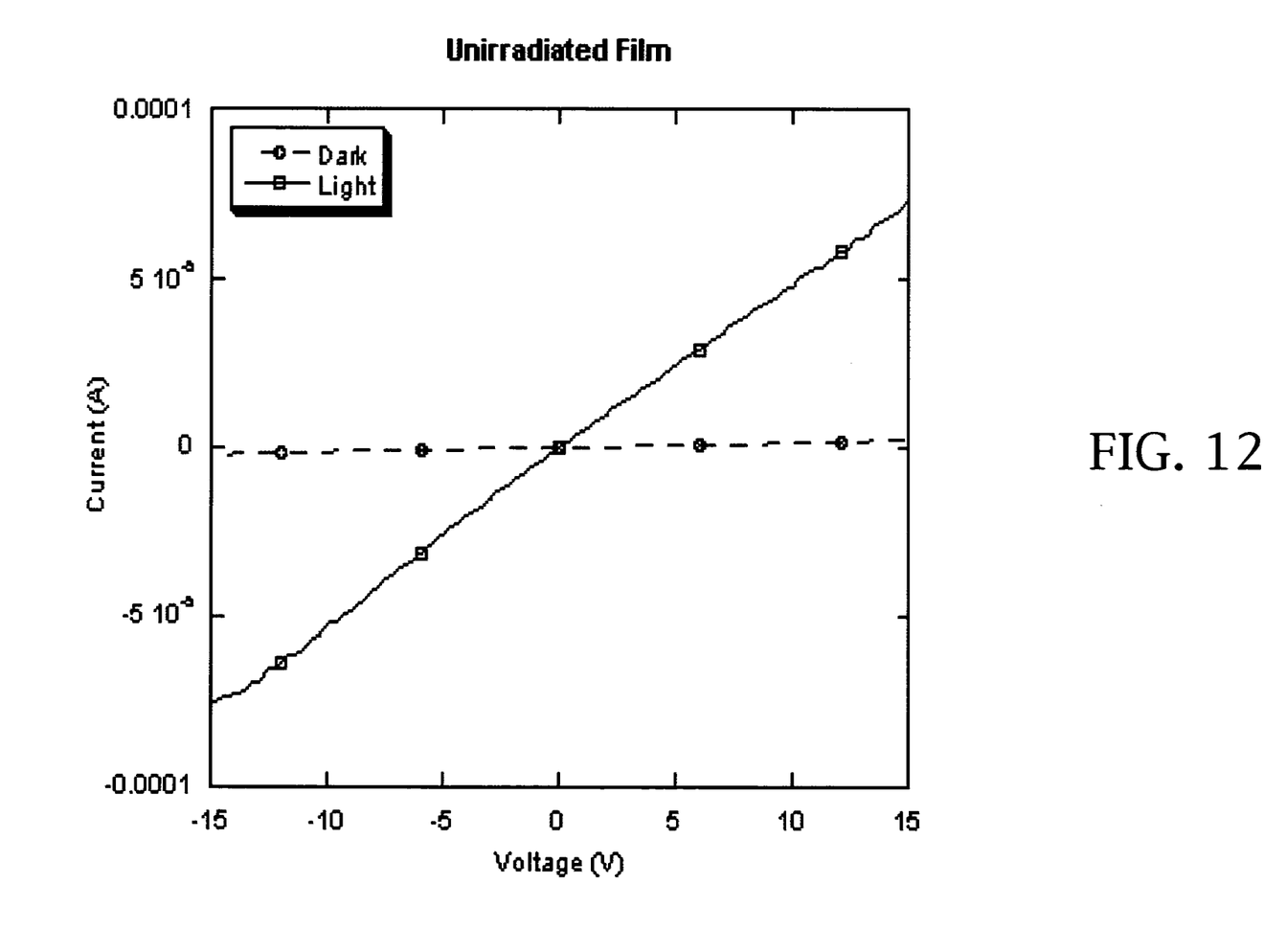
FIG. 12 and FIG. 13 are graphs of current-voltage curves for an unirradiated zinc oxide film (FIG. 12) and an irradiated zinc oxide film (FIG. 13).
Figure 13:
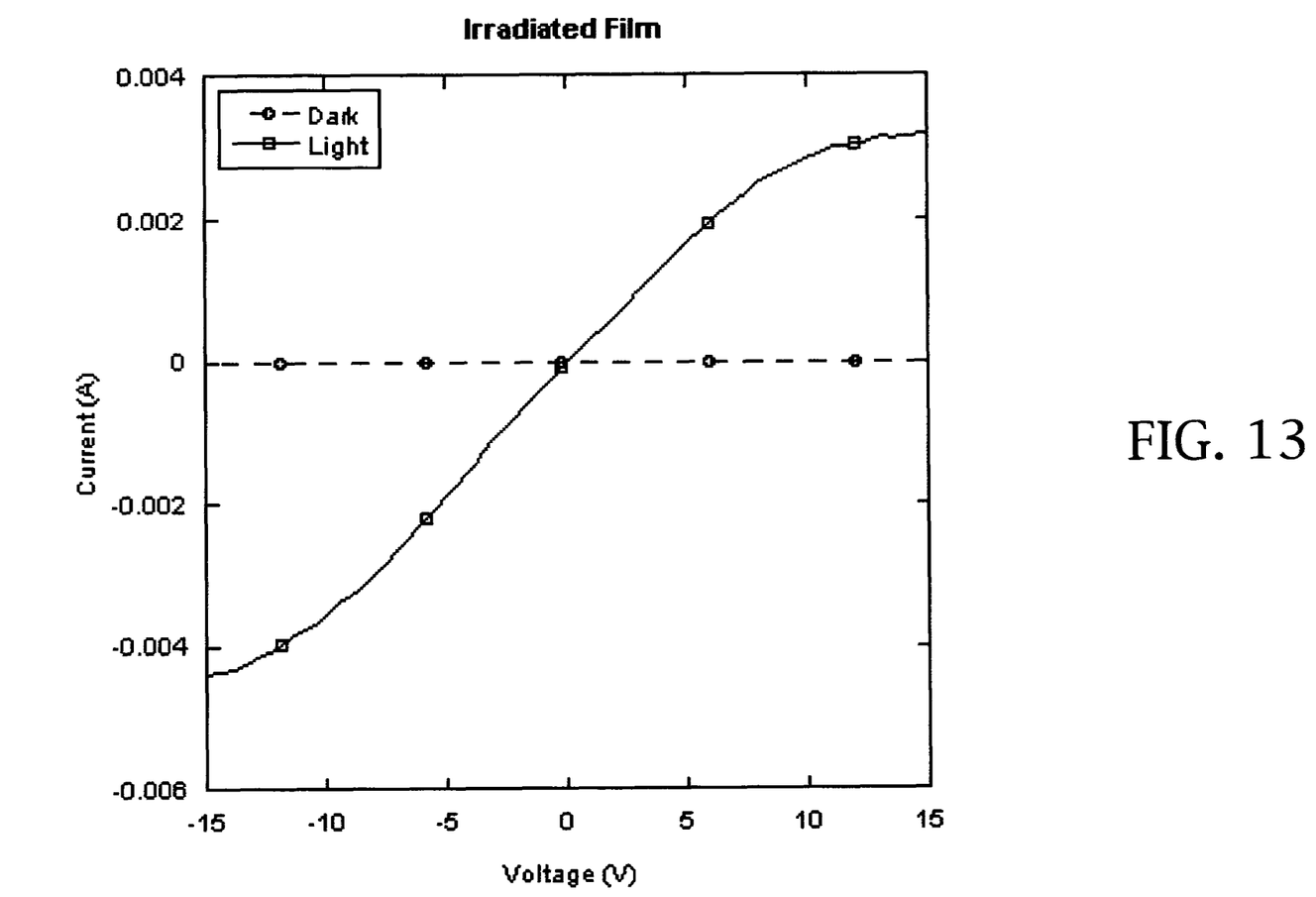
Figure 14:
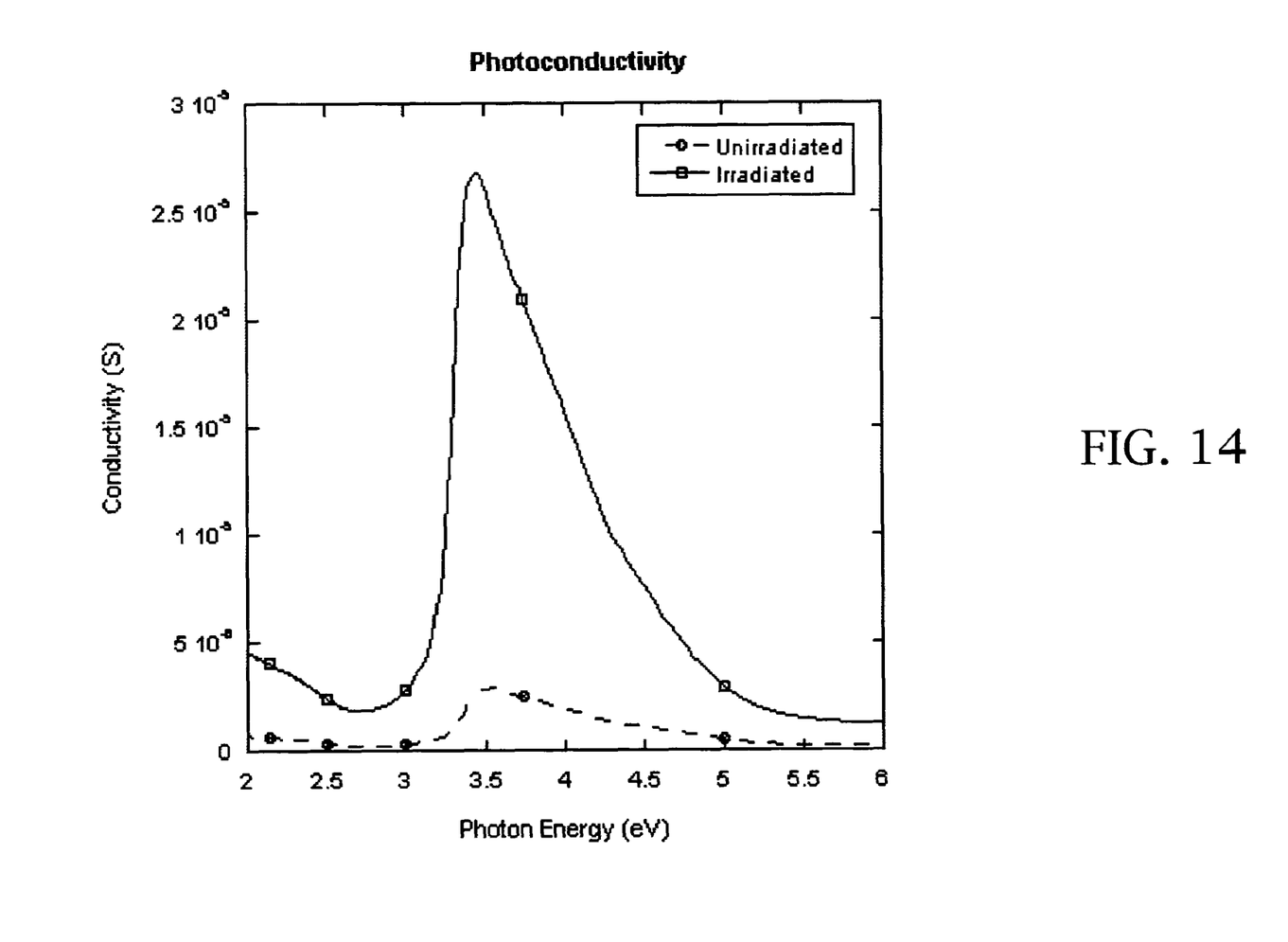
FIG. 14 is a graph of spectrally resolved photoconductivity measurements that were taken of the unirradiated zinc oxide film illustrated in FIG. 12 and the irradiated zinc oxide film illustrated in FIG. 13. Note that the spectrally resolved photoconductive data is not corrected for the spectral dependence of the lamp irradiance which, due to the low UV emission of the lamp used, under-represents the UV response of the film.

With reference to FIG. 12 through FIG. 14, the current-voltage (I-V) curves reiterate the increase in resistivity of the irradiated films as compared to unirradiated films. Furthermore, the irradiated films demonstrate a substantial increase in response to excitation from a mercury lamp. The spectrally resolved photoconductivity data confirms this trend, as the irradiated zinc oxide films show a stronger response to near-band edge and above illumination than do the unirradiated zinc oxide films.

The inventive testing that was conducted involving inventive irradiation of zinc oxide films suggests that nuclear transmutation using high energy $^3$He ion beams is a viable alternative for doping ZnO. Although the inventive testing described hereinabove was conducted with respect to oxygen-containing materials, the inventors believe that invention principles are transferable at least with respect to carbon-containing materials, and quite probably with respect to materials containing other transmutationally operative elements.

The inventive irradiation of ZnO films by 6.6 MeV $^3$He ions for several hours caused substantial improvement in the optical and electrical behavior of the zinc oxide films. A plausible cause for the observed optical and electronic changes in irradiated films is ion-beam induced annealing of point defects. Moreover, surface morphology was altered in terms of the formation of micron-sized blisters caused by the irradiation. The inventively achieved $^{15}$N concentration in the zinc oxide film is believed to be detectable, but is likely too low to detect through commonly available techniques. Further investigation of the present invention can be made. For instance, investigation involving defect analysis by positron annihilation spectrometry (PAS) and channeling RBS measurements can be made to study the ion-beam induced annealing mechanism in ZnO. Further, correlation of defect analysis and crystallography data with inventive irradiation data may lead to unique annealing techniques for ZnO films. In addition, $^3$He ion beam irradiations of higher current densities and/or longer durations may be carried out to investigate the limits of inventive practice.

The present invention, which is disclosed herein, is not to be limited by the embodiments described or illustrated herein, which are given by way of example and not of limitation. Other embodiments of the present invention will be apparent to those skilled in the art from a consideration of the instant disclosure or from practice of the present invention. Various omissions, modifications and changes to the principles disclosed herein may be made by one skilled in the art without departing from the true scope and spirit of the present invention, which is indicated by the following claims.

What is claimed is:

1. A method for changing the physical character of a material, the method comprising:
   providing a material sample including atoms that are nuclearly transmutable via bombardment by helium three ions, wherein said material sample includes a semiconducting solid-state crystalline zinc oxide film; and
   irradiating said material sample with helium three ions so as to effect transmutation, to nitrogen atoms, of oxygen atoms that are contained in said zinc oxide film, said transmutation being of $^{16}$O to $^{15}$N.

2. The method for changing of claim 1 wherein said irradiating includes causing a beam of helium three ions to be incident upon said material sample.

3. The method for changing of claim 1 wherein said irradiating results in changing at least one physical characteristic of said material sample, said physical characteristic being selected from the group consisting of electronic carrier concentration, electronic carrier type, resistivity, photoconductivity, luminescence, and morphology.

4. The method for changing of claim 1 wherein said transmutation further includes transmutation, to fluorine atoms, of oxygen atoms that are contained in said zinc oxide film, said transmutation being of $^{16}O$ to $^{18}F$.

5. The method for changing of claim 4 wherein said irradiating includes causing a beam of helium three ions to be incident upon said material sample.

6. The method for changing of claim 1 wherein said transmutation includes:

transmutation, via bombardment, of $^{16}O$ to $^{15}O$; and transmutation, via decay by positron emission, of $^{15}O$ to $^{15}N$.

7. The method for changing of claim 6 wherein said irradiating includes causing a beam of helium three ions to be incident upon said material sample.

8. The method for changing of claim 6 wherein said irradiating results in changing at least one physical characteristic of said material sample, said physical characteristic being selected from the group consisting of electronic carrier concentration, electronic carrier type, resistivity, photoconductivity, luminescence, and morphology.

9. The method for changing of claim 8 wherein said irradiating includes causing a beam of helium three ions to be incident upon said material sample.

10. The method for changing of claim 9 wherein said transmutation further includes transmutation, to fluorine atoms, of oxygen atoms that are contained in said zinc oxide film, said transmutation being of $^{16}O$ to $^{18}F$.

11. A method for doping a material, the method comprising:

positioning a target entity in a chamber of a particle accelerator apparatus, said target entity including a material film containing semiconducting solid-state zinc oxide; and irradiating said target entity with $^3He$ ions via a high energy beam so that transmutation results in said target entity of at least some oxygen atoms to nitrogen atoms, said transmutation including transmutation, to $^{15}N$, of $^{16}O$ contained in said zinc oxide, wherein said transmutation of $^{16}O$ to $^{15}N$ includes:

transmutation, via bombardment, of $^{16}O$ to $^{15}O$; and transmutation, via decay by positron emission, of $^{15}O$ to $^{15}N$.

12. The method for doping of claim 11, wherein said target entity prior to said irradiation is lower in at least one of resistance and photoconductivity than is said target entity subsequent to said irradiation.

13. The method for doping of claim 11, wherein said zinc oxide is crystalline.

14. The method for doping of claim 11, wherein said irradiating includes causing a beam of helium three ions to be incident upon said material film.

15. The method for doping of claim 11, wherein said irradiating results in changing at least one physical characteristic of said material film, said physical characteristic being selected from the group consisting of electronic carrier concentration, electronic carrier type, resistivity, photoconductivity, luminescence, and morphology.

16. The method for doping of claim 15, wherein said irradiating includes causing a beam of helium three ions to be incident upon said material film.

17. The method for doping of claim 16, wherein said transmutation further includes transmutation, to fluorine atoms, of oxygen atoms that are contained in said zinc oxide, said transmutation being of $^{16}O$ to $^{18}F$.

18. A method for changing the physical character of a material, the method comprising:

providing a material film including atoms that are nuclearly transmutable via bombardment by helium three ions, wherein said material film includes semiconducting solid-state zinc oxide; and irradiating said material film with helium three ions so as to effect transmutation, to nitrogen atoms, of oxygen atoms that are contained in said zinc oxide, said transmutation being of $^{16}O$ to $^{15}N$.

19. The method for changing of claim 18 wherein:

said material film is crystalline;

said irradiating includes causing a beam of helium three ions to be incident upon said material film;

said irradiating results in changing at least one physical characteristic of said material film, said physical characteristic being selected from the group consisting of electronic carrier concentration, electronic carrier type, resistivity, photoconductivity, luminescence, and morphology;

said transmutation includes: transmutation, via bombardment, of $^{16}O$ to $^{15}O$; and transmutation, via decay by positron emission, of $^{15}O$ to $^{15}N$.

* * * * *